United States Patent
Kato et al.

(10) Patent No.: US 11,581,469 B2
(45) Date of Patent: Feb. 14, 2023

(54) THERMOELECTRIC CONVERSION MATERIAL CHIP MANUFACTURING METHOD, AND METHOD FOR MANUFACTURING THERMOELECTRIC CONVERSION MODULE USING CHIP OBTAINED BY SAID MANUFACTURING METHOD

(71) Applicant: LINTEC CORPORATION, Itabashi-ku (JP)

(72) Inventors: Kunihisa Kato, Warabi (JP); Tsuyoshi Muto, Saitama (JP); Masaya Todaka, Saitama (JP); Yuma Katsuta, Gyoda (JP)

(73) Assignee: LINTEC CORPORATION, Itabashi-ku (JP)

( * ) Notice: Subject to any disclaimer, the term of this patent is extended or adjusted under 35 U.S.C. 154(b) by 37 days.

(21) Appl. No.: 17/271,021

(22) PCT Filed: Aug. 27, 2019

(86) PCT No.: PCT/JP2019/033405
§ 371 (c)(1),
(2) Date: Feb. 24, 2021

(87) PCT Pub. No.: WO2020/045376
PCT Pub. Date: Mar. 5, 2020

(65) Prior Publication Data
US 2021/0257531 A1 Aug. 19, 2021

(30) Foreign Application Priority Data
Aug. 28, 2018 (JP) .............................. JP2018-159259

(51) Int. Cl.
| | | |
|---|---|---|
| *H01L 35/34* | (2006.01) | |
| *H01L 35/08* | (2006.01) | |
| *H01L 35/32* | (2006.01) | |

(52) U.S. Cl.
CPC .............. *H01L 35/34* (2013.01); *H01L 35/08* (2013.01); *H01L 35/32* (2013.01)

(58) Field of Classification Search
CPC .......... H01L 35/34; H01L 35/08; H01L 35/32
See application file for complete search history.

(56) References Cited

U.S. PATENT DOCUMENTS

| 7,531,739 B1 | 5/2009 | Moczygemba |
| 2010/0108117 A1 | 5/2010 | Hamano et al. |

(Continued)

FOREIGN PATENT DOCUMENTS

| JP | 2010-109132 A | 5/2010 |
| JP | 2010-192764 A | 9/2010 |

(Continued)

OTHER PUBLICATIONS

KR-100984108-B1, Machine Translation (Year: 2010).*
International Search Report dated Nov. 19, 2019 in PCT/JP2019/033405 filed on Aug. 27, 2019, 2 pages.

*Primary Examiner* — Devina Pillay
(74) *Attorney, Agent, or Firm* — Oblon, McClelland, Maier & Neustadt, L.L.P.

(57) ABSTRACT

A method for producing a chip of a thermoelectric conversion material formed of a thermoelectric semiconductor composition, including a step of forming a sacrificial layer on a substrate, (B) a step of forming a thermoelectric conversion material layer of a thermoelectric semiconductor composition on the sacrificial layer, (C) a step of annealing the thermoelectric conversion material layer, (D) a step of transferring the annealed thermoelectric conversion material layer to a pressure-sensitive adhesive layer, (E) a step of (Continued)

individualizing the thermoelectric conversion material layer into individual chips of a thermoelectric conversion material, and (F) a step of peeling the individualized chips of a thermoelectric conversion material; and a method for producing a thermoelectric conversion module using the chip produced according to the production method.

15 Claims, 2 Drawing Sheets

(56) References Cited

U.S. PATENT DOCUMENTS

| | | | | |
|---|---|---|---|---|
| 2011/0156277 | A1* | 6/2011 | Takamoto | H01L 21/67132 |
| | | | | 257/778 |
| 2016/0163950 | A1* | 6/2016 | Liao | H01L 35/32 |
| | | | | 136/205 |
| 2017/0033272 | A1* | 2/2017 | Pedaci | H01L 35/34 |
| 2018/0145056 | A1* | 5/2018 | Yoo | H05K 999/99 |
| 2018/0233648 | A1* | 8/2018 | Cho | H01L 35/34 |

FOREIGN PATENT DOCUMENTS

| | | |
|---|---|---|
| JP | 2012-204452 A | 10/2012 |
| JP | 2017-98283 A | 6/2017 |
| KR | 100984108 B1 * | 9/2010 |

* cited by examiner

THERMOELECTRIC CONVERSION MATERIAL CHIP MANUFACTURING METHOD, AND METHOD FOR MANUFACTURING THERMOELECTRIC CONVERSION MODULE USING CHIP OBTAINED BY SAID MANUFACTURING METHOD

TECHNICAL FIELD

The present invention relates to a method for producing a chip of a thermoelectric conversion material that carries out energy interconversion between heat and electricity, and to a method for producing a thermoelectric conversion module using the chip produced according to the production method.

BACKGROUND ART

Heretofore, there is known a device that enables direct interconversion between heat energy and electric energy by a thermoelectric conversion module having a thermoelectric effect such as a Seebeck effect and a Peltier effect, as one means of effective energy utilization.

As the thermoelectric conversion module, use of a so-called n-type thermoelectric conversion device is known. Regarding the n-type device, a pair of electrodes spaced from each other are arranged on a substrate and, for example, a P-type thermoelectric element is arranged on one electrode while an N-type thermoelectric element is on the other electrode, as similarly spaced from each other, and the upper faces of the two thermoelectric semiconductor elements are connected to the electrodes of a facing substrate to constitute such a n-type device. In addition, use of a so-called in-plane-type thermoelectric conversion device is known. Regarding the in-plane-type device, P-type thermoelectric elements and N-type thermoelectric elements are alternately arranged in the in-plane direction of a substrate, and for example, the lower parts of the junctions between the two thermoelectric elements are connected in series via an electrode therebetween to constitute such an in-plane-type device.

Given the situation, there are demands for improving the flexibility of thermoelectric conversion modules, thinning the modules and improving the thermoelectric performance thereof. For satisfying these demands, for example, a resin substrate of polyimide or the like is used as a substrate for thermoelectric conversion modules from the viewpoint of heat resistance and flexibility thereof. As an N-type thermoelectric semiconductor material and a P-type thermoelectric semiconductor material, a thin film of a bismuth telluride material is used from the viewpoint of thermoelectric performance, and as an electrode, a Cu electrode having a high thermal conductivity and a low resistance is used (PTLs 1 and 2).

CITATION LIST

Patent Literature

PTL 1: JP 2010-192764 A
PTL 2: JP 2012-204452 A

SUMMARY OF INVENTION

Technical Problem

However, as described above, regarding the above-mentioned demands for improving the flexibility of thermoelectric conversion modules, thinning the modules and improving the thermoelectric performance thereof, the present inventors' investigations have revealed a risk of occurrence of some new problems that, in the case where a bismuth telluride material is used as a thermoelectric semiconductor material to be contained in a thermoelectric conversion material formed of a thermoelectric semiconductor composition, a Cu electrode is used as an electrode and a polyimide or the like resin is used as a substrate, and for example, in a step of annealing a thermoelectric conversion module at a high temperature of 300° C. or so, an alloy layer is formed by diffusion in the junction between the thermoelectric semiconductor material contained in the thermoelectric conversion material and the Cu electrode and, as a result, the electrode may often crack or peel to increase the electric resistance value between the thermoelectric conversion material and the Cu electrode to thereby result in thermoelectric performance degradation. In the case of using a substrate that uses a resin such as a polyimide, the heatproof temperature of the substrate may be lower than the optimum annealing temperature for the thermoelectric semiconductor material, and in such a case, optimum annealing could not be attained.

In consideration of the above, an object of the present invention is to provide a method for producing a chip of a thermoelectric conversion material that enables annealing treatment of a thermoelectric conversion material in the form not having a junction with an electrode, and enables annealing of a thermoelectric semiconductor material at an optimum annealing temperature, and to provide a method for producing a thermoelectric conversion module using the chip.

Solution to Problem

The present inventors have assiduously made repeated studies for solving the above-mentioned problems and, as a result, have found a method for producing plural chips of a thermoelectric conversion material annealed in the form not having a junction with an electrode, which includes providing a specific sacrificial layer on a substrate, then forming a thermoelectric conversion material layer on the sacrificial layer, annealing these at a high temperature, and thereafter transferring the thermoelectric conversion material layer to a pressure-sensitive adhesive layer, and then individualizing the thermoelectric conversion material layer into individual chips (hereinafter the chip may be simply referred to as "chip"), and also a method for producing a thermoelectric conversion module using the chip, and have completed the present invention.

Specifically, the present invention provides the following (1) to (15):

(1) A method for producing a chip of a thermoelectric conversion material formed of a thermoelectric semiconductor composition, including (A) a step of forming a sacrificial layer on a substrate, (B) a step of forming a thermoelectric conversion material layer of a thermoelectric semiconductor composition on the sacrificial layer formed in the step (A), (C) a step of annealing the thermoelectric conversion material layer formed in the step (B), (D) a step of transferring the thermoelectric conversion material layer annealed in the step (C), to a pressure-sensitive adhesive layer, (E) a step of individualizing the thermoelectric conversion material layer in the step (D) into individual chips of a thermoelectric conversion material, and (F) a step of peeling the chips of a thermoelectric conversion material individualized in the step (E).

(2) The method for producing a chip of a thermoelectric conversion material according to the above (1), wherein the step of individualizing the thermoelectric conversion material layer into individual chips of a thermoelectric conversion material is carried out using a dicing blade or a laser.

(3) The method for producing a chip of a thermoelectric conversion material according to the above (1) or (2), further including a step of irradiating the pressure-sensitive adhesive layer with energy ray to lower the adhesive strength of the pressure-sensitive adhesive layer to the thermoelectric conversion material layer or to the chip of a thermoelectric conversion material.

(4) The method for producing a chip of a thermoelectric conversion material according to any of the above (1) to (3), wherein the sacrificial layer contains a resin or a release agent.

(5) The method for producing a chip of a thermoelectric conversion material according to any of the above (1) to (4), wherein the thickness of the sacrificial layer is 10 nm to 10 μm.

(6) The method for producing a chip of a thermoelectric conversion material according to any of the above (1) to (5), wherein the substrate is a glass substrate.

(7) The method for producing a chip of a thermoelectric conversion material according to any of the above (1) to (6), wherein the annealing temperature is 250 to 600° C.

(8) The method for producing a chip of a thermoelectric conversion material according to any of the above (1) to (7), further including a step of forming a solder-receiving layer on the thermoelectric conversion material layer transferred in the step (D), or on the chip of a thermoelectric conversion material individualized in the step (E), or on the chip of a thermoelectric conversion material peeled in the step (F).

(9) The method for producing a chip of a thermoelectric conversion material according to the above (8), wherein the solder-receiving layer is formed of a metal material.

(10) A method for producing a thermoelectric conversion module of a combination of plural chips of a thermoelectric conversion material produced in the production method for a chip of a thermoelectric conversion material according to any of the above (1) to (7), including (i) a step of forming first electrode on a first resin film, (ii) a step of forming a second electrode on a second resin film, (iii) a step of forming a bonding material layer 1 on the first electrode formed in the step (i), (iv) a step of mounting one surface of the chip of a thermoelectric conversion material, on the bonding material layer 1 formed in the step (v) a step of bonding one surface of the chip of a thermoelectric conversion material mounted in the step (iv) to the first electrode via the bonding material layer 1 formed in the step (iii), and (vi) a step of bonding the other surface of the chip of a thermoelectric conversion material after the step (v), to the second electrode formed in the step (ii), via a bonding material layer 2.

(11) A method for producing a thermoelectric conversion module of a combination of plural chips of a thermoelectric conversion material produced in the production method for a chip of a thermoelectric conversion material according to any of the above (1) to (7), including (I) a step of forming a first electrode on a first resin film, (II) a step of forming a bonding material layer 1 on the first electrode formed in the step (I), (III) a step of mounting one surface of the chip of a thermoelectric conversion material on the bonding material layer 1 formed in the step (II), (IV) a step of bonding one surface of the chip of a thermoelectric conversion material mounted in the step (III) to the first electrode via the bonding material layer 1 formed in the step (II), and (V) a step of bonding the other surface of the chip of a thermoelectric conversion material after the step (IV) to the resin film via a bonding material layer 3.

(12) A method for producing a thermoelectric conversion module of a combination of plural chips of a thermoelectric conversion material produced according to the production method for a chip of a thermoelectric conversion material of the above (8), including (xi) a step of forming a first electrode on a first resin film, (xii) a step of forming a second electrode on a second resin film, (xiii) a step of forming a solder material layer on the first electrode formed in the step (xi), (xiv) a step of mounting one surface having a solder-receiving layer of the chip of a thermoelectric conversion material, on the solder material layer formed in the step (xiii), (xv) a step of bonding one surface having the solder-receiving layer of the chip of a thermoelectric conversion material mounted in the step (xiv) to the first electrode via the solder material layer formed in the step (xiii), (xvi) a step of forming a solder-receiving layer on the other surface of the chip of a thermoelectric conversion material after the step (xv), and (xvii) a step of bonding the solder-receiving layer on the other surface of the chip of a thermoelectric conversion material after the step (xvi), to the second electrode formed in the step (xii) via a solder material layer.

(13) A method for producing a thermoelectric conversion module of a combination of plural chips of a thermoelectric conversion material produced according to the production method for a chip of a thermoelectric conversion material of the above (8), including (XI) a step of forming a first electrode on a first resin film, (XII) a step of forming a solder material layer on the first electrode formed in the step (XI), (XIII) a step of mounting one surface having a solder-receiving layer of the chip of a thermoelectric conversion material, on the solder material layer formed in the step (XII), (XIV) a step of bonding one surface having a solder-receiving layer of the chip of a thermoelectric conversion material mounted in the step (XIII), to the first electrode via the solder material layer formed in the step (XII), and (XV) a step of bonding the other surface of the chip of a thermoelectric conversion material after the step (XIV), to a resin film via a bonding material layer 3.

(14) The method for producing a thermoelectric conversion module according to the above (10) or (11), wherein the bonding material layer 1 and the bonding material layer 2 each are independently formed of a solder material, an electroconductive adhesive or a sintering bond.

(15) The method for producing a thermoelectric conversion module according to the above (11) or (13), wherein the bonding material layer 3 is formed of a resin material.

Advantageous Effects of Invention

According to the present invention, there can be provided a method for producing a chip of a thermoelectric conversion material that enables annealing treatment of a thermoelectric conversion material in the form not having a junction with an electrode, and enables annealing of a thermoelectric semiconductor material at an optimum annealing temperature, and a method for producing a thermoelectric conversion module using the chip.

DESCRIPTION OF EMBODIMENTS

[Production Method for Chip of Thermoelectric Conversion Material]

The method for producing a chip of a thermoelectric conversion material of the present invention is a method for producing a chip of a thermoelectric conversion material formed of a thermoelectric semiconductor composition, including (A) a step of forming a sacrificial layer on a substrate, (B) a step of forming a thermoelectric conversion material layer of a thermoelectric semiconductor composition on the sacrificial layer formed in the step (A), (C) a step of annealing the thermoelectric conversion material layer formed in the step (B), (D) a step of transferring the thermoelectric conversion material layer annealed in the step (C), to a pressure-sensitive adhesive layer, (E) a step of individualizing the thermoelectric conversion material layer in the step (D) into individual chips of a thermoelectric conversion material, and (F) a step of peeling the chips of a thermoelectric conversion material individualized in the step (E).

In the method for producing a chip of a thermoelectric conversion material of the present invention, a specific sacrificial layer is provided on a substrate, then a thermoelectric conversion material layer is formed on the sacrificial layer, and thereafter these are annealed at a high temperature, and subsequently the thermoelectric conversion material layer is transferred to a pressure-sensitive adhesive layer, and then the thermoelectric conversion material layer is individualized into chips to readily give annealed chips of a thermoelectric conversion material in the form not having a junction to an electrode.

In the present invention, the sacrificial layer may disappear or may remain after annealing treatment, and not having any influence on the thermoelectric properties of a thermoelectric conversion material layer, this can be defined as a layer having a function of transferring the thermoelectric conversion material layer to a pressure-sensitive adhesive layer on a substrate to be mentioned below. In the present invention, the thermoelectric conversion material is not formed of a single material of a thermoelectric semiconductor material and is, for example, as described below, one formed of a thermoelectric semiconductor composition further containing a heat-resistant resin, an ionic liquid and others.

The method for producing a chip of a thermoelectric conversion material of the present invention is described below with reference to drawings.

Figure 1:
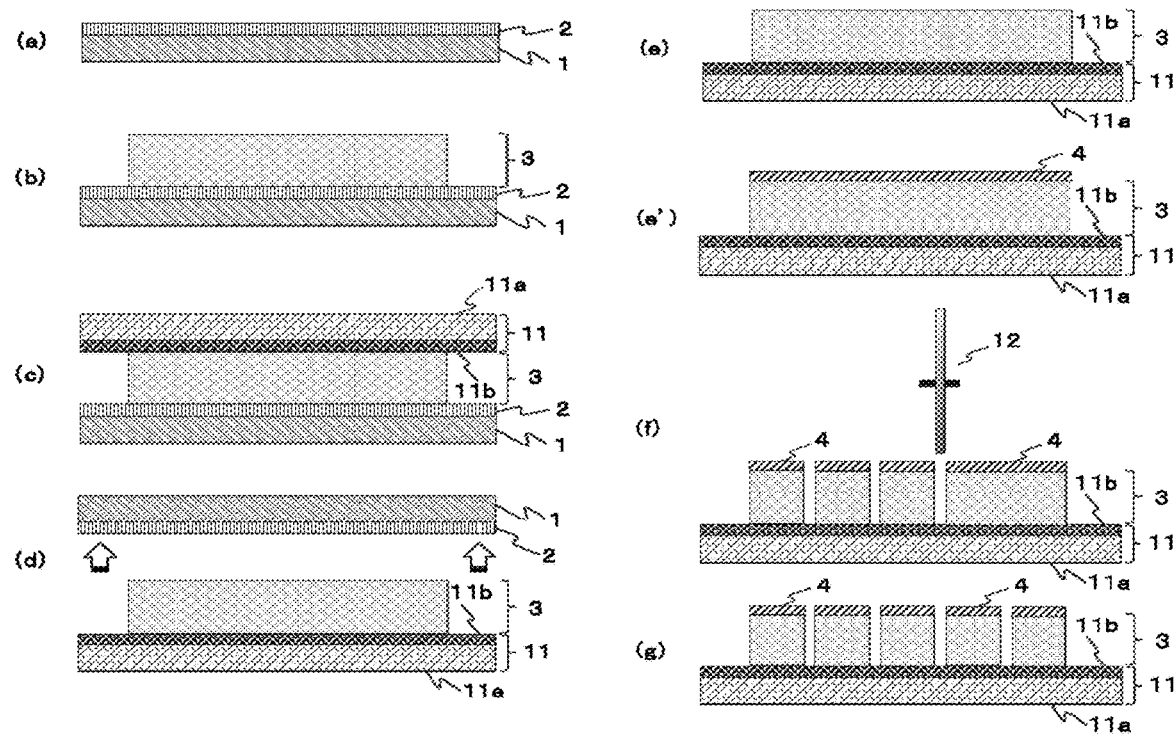
FIG. 1 is an explanatory view showing a flow of an example of a process according to the production method for a chip of a thermoelectric conversion material of the present invention.

FIG. 1 is an explanatory view showing a flow of an example of a process according to the production method for a chip of a thermoelectric conversion material of the present invention, in which (a) is a cross-sectional view after forming a sacrificial layer on a substrate, (b) is a cross-sectional view after forming a thermoelectric conversion material layer on the sacrificial layer and annealing them, (c) is a cross-sectional view after bonding a thermoelectric conversion material layer to a pressure-sensitive adhesive layer on the substrate, (d) is a cross-sectional view showing an embodiment where the thermoelectric conversion material layer is peeled from the sacrificial layer and the thermoelectric conversion material layer is transferred to the pressure-sensitive adhesive layer, (e) is a cross-sectional view showing an embodiment after the annealed thermoelectric conversion material layer is transferred to the pressure-sensitive adhesive layer, (e') is a cross-sectional view after forming a solder-receiving layer to be mentioned below on the thermoelectric conversion material layer, (f) is a cross-sectional schematic view showing an embodiment of individualizing the solder-receiving layer-having thermoelectric conversion material layer formed in (e') into chips of the thermoelectric conversion material by dicing, and (g) is a cross-sectional view showing a solder-receiving layer-having chip of a thermoelectric conversion material formed on the pressure-sensitive adhesive layer in (f). After this, as will be mentioned below, for example, the pressure-sensitive adhesive layer is irradiated with energy ray to lower the adhesive strength of the pressure-sensitive adhesive layer, and accordingly, the chips of a thermoelectric conversion material can be readily peeled from the pressure-sensitive adhesive layer. In that manner, chips of a thermoelectric conversion material can be produced.

(A) Sacrificial Layer Forming Step

The production method for a chip of a thermoelectric conversion material of the present invention includes a sacrificial layer forming step. The sacrificial layer forming step is a step of forming a sacrificial layer on a substrate, and for example, in FIG. 1 (a), this is a step of applying a resin or a release agent to the substrate 1 to form the sacrificial layer 2.

(Sacrificial Layer)

In the production method for a chip of a thermoelectric conversion material of the present invention, a sacrificial layer is used.

The sacrificial layer is provided between a substrate and a thermoelectric conversion material layer to be mentioned below, and, after annealed at a predetermined temperature along with the thermoelectric conversion material layer, this functions for facilitating peeling of the thermoelectric conversion material and transferring the thermoelectric conversion material layer to the pressure-sensitive adhesive layer on the substrate to be mentioned below.

As mentioned above, the material of forming the sacrificial layer may be any one that disappears or remains after annealing treatment, and resultantly has a function of facilitating peeling of the thermoelectric conversion material layer and transferring the thermoelectric conversion material layer to the pressure-sensitive adhesive layer on a substrate, without having any influence on the properties of the resultant thermoelectric conversion material layer. A resin and a release agent satisfying both the functions are preferred.

(Resin)

Not specifically limited, the resin to constitute the sacrificial layer for use in the present invention may be a thermoplastic resin or a curable resin. The thermoplastic resin includes acrylic resins such as polymethyl (meth)acrylate, polyethyl (meth)acrylate, and methyl (meth)acrylate-butyl (meth)acrylate copolymers; polyolefin-based resins such as polyethylene, polypropylene, and polymethylpentene; thermoplastic polyester resins such as polycarbonate resins, polyethylene terephthalate, and polyethylene naphthalate; and polystyrene, acrylonitrile-styrene copolymers, polyvinyl acetate, ethylene-vinyl acetate copolymers, vinyl chloride, polyurethane, polyvinyl alcohol, polyvinyl pyrrolidone, and ethyl cellulose. Polymethyl (meth)acrylate means polymethyl acrylate and polymethyl methacrylate, and the same shall apply to (meth). The curable resins include thermosetting resins and photocurable resins. The thermosetting resins include epoxy resins, silicone resins and phenolic resins. The photocurable resins include photocurable acrylic resins, photocurable urethane resins, and photocurable epoxy resins.

Among these, from the viewpoint that a thermoelectric conversion material layer can be formed on a sacrificial layer and that the thermoelectric conversion material layer can be readily peeled even after annealing treatment at a high temperature, the thermoplastic resin is preferred, polymethyl methacrylate, polystyrene, polyvinyl alcohol, polyvinyl pyrrolidone and ethyl cellulose are preferred; and from the viewpoint of raw material cost, peelability and maintenance of properties of thermoelectric conversion material, polymethyl methacrylate and polystyrene are more preferred.

Also preferably, the mass reduction ratio of the resin at an annealing temperature to be mentioned below in thermogravimetric measurement (TG) is 90% or more, more preferably 95% or more, even more preferably 99% or more. When the mass reduction ratio falls within the range, the resin does not lose the function of peeling a chip of a thermoelectric conversion material even when the chip of a thermoelectric conversion material is annealed, as mentioned below.

(Release Agent)

Not specifically limited, the release agent to constitute the sacrificial layer for use in the present invention includes a fluorine-based release agent (fluorine atom-containing compound, for example, polytetrafluoroethylene), a silicone-based release agent (silicone compound, for example, a silicone resin, a polyorganosiloxane having a polyoxyalkylene unit), a higher fatty acid or a salt thereof (for example, a metal salt), a higher fatty acid ester, and a higher fatty acid amide.

Among these, from the viewpoint that a chip of a thermoelectric conversion material can be formed on a sacrificial layer and that a chip of a thermoelectric conversion material can be readily peeled (released) even after annealing treatment at a high temperature, a fluorine-based release agent, and a silicone-based release agent are preferred; and form the viewpoint of raw material cost, peelability and maintenance of properties of thermoelectric conversion material, a fluorine-based release agent is more preferred.

The thickness of the sacrificial layer is preferably 10 nm to 10 µm, more preferably 50 nm to 5 µm, even more preferably 200 nm to 2 µm. When the thickness of the sacrificial layer falls within the range, peeling of a thermoelectric conversion material layer after annealing treatment is easy, and the chip of a thermoelectric conversion material to be finally formed can readily maintain thermoelectric performance.

In particular, the thickness of the sacrificial layer using a resin is preferably 50 nm to 10 µm, more preferably 100 nm to 5 µm, even more preferably 200 nm to 2 µm. When the thickness of the sacrificial layer using a resin falls within the range, peeling after annealing treatment is easy, and the chip of a thermoelectric conversion material to be finally formed can readily maintain thermoelectric performance. Further in the case, even when any other layer is further laminated on the sacrificial layer, the chip can be readily maintained as such.

Similarly, the thickness of the sacrificial layer using a release agent is preferably 10 nm to 5 µm, more preferably 50 nm to 1 µm, even more preferably 100 nm to 0.5 µm, further more preferably 200 nm to 0.1 µm. When the thickness of the sacrificial layer using a release agent falls within the range, peeling after annealing treatment is easy, and the chip of a thermoelectric conversion material to be finally formed can readily maintain thermoelectric performance.

The sacrificial layer is formed using the above-mentioned resin or a release agent.

A method for forming the sacrificial layer includes various coating methods on a substrate, such as a clip coating method, a spin coating method, a spray coating method, a gravure coating method, a die coating method and a doctor blade method. The method is appropriately selected depending on the properties of the resin or the release agent used.

(Substrate)

The substrate includes glass, silicon, ceramic, metal and plastic. From the viewpoint of carrying out annealing treatment at a high temperature, glass, silicon, ceramic and metal are preferred; and from the viewpoint of adhesiveness to sacrificial layer, raw material cost and dimensional stability after heat treatment, use of glass, silicon and ceramic is more preferred.

The thickness of the substrate is, from the viewpoint of process and dimensional stability, preferably 100 to 1200 µm, more preferably 200 to 800 µm, even more preferably 400 to 700 µm.

(B) Thermoelectric Conversion Material Layer Forming Step

The production method for a chip of a thermoelectric conversion material of the present invention incudes a thermoelectric conversion material layer forming step.

The thermoelectric conversion material layer forming step is a step of forming a thermoelectric conversion material layer on a sacrificial layer and, for example, as in FIG. 1(b), this is a step of forming a thin film of a thermoelectric conversion material layer 3 of a thermoelectric semiconductor composition on the sacrificial layer 2.

(Thermoelectric Conversion Material)

The thermoelectric conversion material for use in the present invention is formed of a thermoelectric semiconductor composition. Preferably, it is formed of a thin film of a thermoelectric semiconductor composition containing a thermoelectric semiconductor material (hereinunder may be referred to as "thermoelectric semiconductor fine particles"), a heat-resistant resin, and an ionic liquid and/or an inorganic ionic compound.

(Thermoelectric Semiconductor Material)

The thermoelectric semiconductor material for use in the present invention, namely the thermoelectric semiconductor material contained in the chip of a P-type thermoelectric conversion material and the chip of an N-type thermoelectric conversion material is not specifically limited so far as the material is one capable of generating a thermoelectric force when given a temperature difference, and examples thereof include a bismuth-tellurium-based thermoelectric semiconductor material such as a P-type bismuth telluride, and an N-type bismuth telluride; a telluride-based thermoelectric semiconductor material such as GeTe and PbTe; an antimony-tellurium-based thermoelectric semiconductor material; a zinc-antinomy-based thermoelectric semiconductor material such as ZnSb, $Zn_3Sb_2$, and $Zn_4Sb_3$; a silicon-germanium-based thermoelectric semiconductor material such as SiGe; a bismuth-selenide-based thermoelectric semiconductor material such as $Bi_2Se_3$; a silicide-based thermoelectric semiconductor material such as $\beta$-$FeSi_2$, $CrSi_2$, $MnSi_{1.73}$, and $Mg_2Si$; an oxide-based thermoelectric semiconductor material; a Heusler material such as FeVAl, FeVAlSi, and FeVTiAl; and a sulfide-based thermoelectric semiconductor material such as $TiS_2$.

Among these, a bismuth-tellurium-based thermoelectric semiconductor material, a telluride-based thermoelectric semiconductor material, an antimony-tellurium-based thermoelectric semiconductor material or a bismuth-selenide-based thermoelectric semiconductor material is preferred.

Further, from the viewpoint of thermoelectric performance, a bismuth-tellurium-based thermoelectric semiconductor material such as a P-type bismuth telluride or an N-type bismuth telluride is more preferred.

The carrier of the P-type bismuth telluride is a hole and the Seebeck coefficient thereof is positive, for which, for example, preferably used is one represented by $Bi_XTe_3Sb_{2-X}$. In this case, X preferably satisfies $0 < X \leq 0.8$, more preferably $0.4 \leq X \leq 0.6$. X being more than 0 and 0.8 or less is preferred since the Seebeck coefficient and the electrical conductivity of the material are large and the material can maintain the characteristics of a P-type thermoelectric element.

The carrier of the N-type bismuth telluride is an electron and the Seebeck coefficient thereof is negative, for which, for example, preferably used is one represented by $Bi_2Te_{3-Y}Se_Y$. In this case, Y is preferably $0 \leq Y \leq 3$ (when Y=0, $Bi_2Te_3$), more preferably $0 \leq Y \leq 2.7$. Y being 0 or more and 3 or less is preferred since the Seebeck coefficient and the electrical conductivity of the material are large and the material can maintain the characteristics of an N-type thermoelectric element.

The thermoelectric semiconductor fine particles for use in the thermoelectric semiconductor composition are those prepared by pulverizing the above-mentioned thermoelectric semiconductor material into a predetermined size using a pulverizer or the like.

The blending amount of the thermoelectric semiconductor fine particles in the thermoelectric semiconductor composition is preferably 30 to 99% by mass. The amount is more preferably 50 to 96% by mass, even more preferably 70 to 95% by mass. The blending amount of the thermoelectric semiconductor fine particles falling within the above range is preferred since the Seebeck coefficient (absolute value of Peltier coefficient) is large, the electrical conductivity reduction can be prevented, only the thermal conductivity is lowered, and therefore the composition exhibits high-level thermoelectric performance and can form a film having a sufficient film strength and flexibility.

The average particle size of the thermoelectric semiconductor fine particles is preferably 10 nm to 200 μm, more preferably 10 nm to 30 μm, even more preferably 50 nm to 10 μm, and especially preferably 1 to 6 μm. Falling within the range, uniform dispersion is easy and electrical conductivity can be increased.

The method of producing the thermoelectric semiconductor fine particles by finely pulverizing the thermoelectric semiconductor material is not specifically defined, and the material may be pulverized to have a predetermined size, using a known pulverizer or the like, such as a jet mill, a ball mill, a bead mill, a colloid mill, or a roller mill.

The average particle size of the thermoelectric semiconductor fine particles may be measured with a laser diffraction particle sizer (Master Sizer 3000 from Malvern Corporation), and the median value of the particle size distribution is taken as the average particle size.

Preferably, the thermoelectric semiconductor fine particles are heat-treated. ("Heat treatment as referred to herein differs from "annealing treatment" to be carried out in the annealing step in the present invention.) The heat treatment increases the crystallinity of the thermoelectric semiconductor fine particles and further increases the Seebeck coefficient or the Peltier coefficient of the thermoelectric conversion material since the surface oxide film of the thermoelectric semiconductor fine particles could be removed, therefore further increasing the figure of merit thereof. Not specifically defined, the heat treatment is preferably carried out in an inert gas atmosphere such as nitrogen or argon in which the gas flow rate is controlled or in a reducing gas atmosphere such as hydrogen in which also the gas flow rate is controlled, or in a vacuum condition, and is more preferably carried out in a mixed gas atmosphere of an inert gas and a reducing gas so as to have no negative influence on the thermoelectric semiconductor fine particles before preparing the thermoelectric semiconductor composition. Specific temperature conditions depend on the thermoelectric semiconductor fine particles to be used, but in general, it is desirable that the treatment is carried out at a temperature not higher than the melting point of the fine particles but falling between 100 and 1500° C., for a few minutes to several tens of hours.

(Heat-Resistant Resin)

In the thermoelectric semiconductor composition for use in the present invention, from the viewpoint of annealing the thermoelectric semiconductor material at a high temperature, a heat-resistant resin is preferably used. The resin acts as a binder between the thermoelectric semiconductor material (thermoelectric semiconductor fine particles) and enhances the flexibility of the thermoelectric conversion module, and in addition, the resin can facilitate formation of a thin film by coating. The heat-resistant resin is not specifically defined but is preferably one that can maintain various physical properties thereof such as mechanical strength and thermal conductivity thereof as a resin without losing them in crystal growth of the thermoelectric semiconductor fine particles through annealing treatment of the thin film of the thermoelectric semiconductor composition.

The heat-resistant resin is preferably a polyamide resin, a polyamideimide resin, a polyimide resin or an epoxy resin from the viewpoint that the heat resistance thereof is higher and that the resin has no negative influence on the crystal growth of the thermoelectric semiconductor fine particles in the thin film, and is more preferably a polyamide resin, a polyamideimide resin or a polyimide resin from the viewpoint of excellent flexibility thereof. In the case where a polyimide film is used as the substrate, the heat-resistant resin is more preferably a polyimide resin from the viewpoint of adhesiveness thereof to the polyimide film. In the present invention, polyimide resin is a generic term for polyimide and its precursors.

Preferably, the decomposition temperature of the heat-resistant resin is 300° C. or higher. When the decomposition temperature falls within the above range, the resin does not lose the function thereof as a binder and can maintain flexibility even when the thin film of the thermoelectric semiconductor composition is annealed, as described below.

Preferably, the mass reduction in the heat-resistant resin at 300° C. in thermogravimetry (TG) is 10% or less, more preferably 5% or less, even more preferably 1% or less. When the mass reduction falls within the above range, the resin does not lose the function thereof as a binder and can maintain the flexibility of the thermoelectric conversion material layer even when the thin film of the thermoelectric semiconductor composition is annealed, as described below.

The blending amount of the heat-resistant resin in the thermoelectric semiconductor composition is preferably 0.1 to 40% by mass, more preferably 0.5 to 20% by mass, even more preferably 1 to 20% by mass, still more preferably 2 to 15% by mass. When the blending amount of the heat-resistant resin falls within the above range, the thermoelectric semiconductor material functions as a binder, and facilitates formation of a thin film to give a film satisfying both high-level thermoelectric performance and a high film strength.

(Ionic Liquid)

The ionic liquid for use in the present invention is a molten salt of a combination of a cation and an anion, which can exist as a liquid in a broad temperature range of −50 to 500° C. The ionic liquid is characterized in that it has an extremely low vapor pressure and is nonvolatile, has excellent thermal stability and electrochemical stability, has a low viscosity and has a high ionic conductivity, and therefore, serving as a conductive assistant, the ionic liquid can effectively prevent reduction in the electrical conductivity between thermoelectric semiconductor fine particles. In addition, the ionic liquid has high polarity based on the aprotic ionic structure thereof, and is excellent in compatibility with the heat-resistance resin, and therefore can make the thermoelectric conversion material layer have a uniform electrical conductivity.

The ionic liquid for use herein may be a known one or a commercially-available one. Examples thereof include those composed of a cation component of a nitrogen-containing cyclic cation compound such as pyridinium, pyrimidinium, pyrazolium, pyrrolidinium, piperidinium or imidazolium, or a derivative thereof, an amine-type cation such as tetraalkylammonium, or a derivative thereof, a phosphine-type cation such as phosphonium, trialkyl sulfonium or tetraalkyl phosphonium, or a derivative thereof, or a lithium cation or a derivative thereof, and an anion component of a chloride ion such as $Cl^-$, $AlCl_4^-$, $Al_2Cl_7^-$ or $ClO_4^-$, a bromide ion such as $Br^-$, an iodide ion such as $I^-$, a fluoride ion such as $BF_4^-$ or $PF_6^-$, a halide anion such as $F(HF)_n^-$, or any other anion component such as $NO_3^-$, $CH_3COO^-$, $CF_3COO^-$, $CH_3SO_3^-$, $CF_3SO_3^-$, $(FSO_2)_2N^-$, $(CF_3SO_2)_2N^-$, $(CF_3SO_2)_3C^-$, $AsF_6^-$, $SbF_6^-$, $NbF_6^-$, $TaF_6^-$, $F(HF)_n^-$, $(CN)_2N^-$, $C_4F_9SO_3^-$, $(C_2F_5SO_2)_2N^-$, $C_3F_7COO^-$, or $(CF_3SO_2)(CF_3CO)N^-$. Among the above-mentioned ionic liquids, it is preferable that, from the viewpoint of enhancing high-temperature stability and compatibility between thermoelectric semiconductor fine particles and resin, and preventing reduction in the electrical conductivity between thermoelectric semiconductor fine particles, the cation component in the ionic liquid contains at least one selected from a pyridinium cation and a derivative, and an imidazolium cation and a derivative thereof. It is also preferable that the anion component of the ionic liquid contains a halide anion, more preferably at least one selected from $Cl^-$, $Br^-$ and $I^-$.

Specific examples of the ionic liquid in which the cation component contains a pyridinium cation or a derivative thereof include 4-methyl-butylpyridinium chloride, 3-methyl-butylpyridinium chloride, 4-methyl-hexylpyridinium chloride, 3-methyl-hexylpyridinium chloride, 4-methyl-octylpyridinium chloride, 3-methyl-octylpyridinium chloride, 3,4-dimethyl-butylpyridinium chloride, 3,5-dimethyl-butylpyridinium chloride, 4-methyl-butylpyridinium tetrafluoroborate, 4-methyl-butylpyridinium hexafluorophosphate, 1-butyl-4-methylpyridinium bromide, 1-butyl-4-methylpyridinium hexafluorophosphate, and 1-butyl-4-methylpyridinium iodide. Among these, 1-butyl-4-methylpyridinium bromide, 1-butyl-4-methylpyridinium hexafluorophosphate and 1-butyl-4-methylpyridinium iodide are preferred.

Specific examples of the ionic liquid in which the cation component contains an imidazolium cation or a derivative thereof include [1-butyl-3-(2-hydroxyethyl)imidazolium bromide], [1-butyl-3-(2-hydroxyethyl)imidazolium tetrafluoroborate], 1-ethyl-3-methylimidazolium chloride, 1-ethyl-3-methylimidazolium bromide, 1-butyl-3-methylimidazolium chloride, 1-hexyl-3-methylimidazolium chloride, 1-octyl-3-methylimidazolium chloride, 1-decyl-3-methylimidazolium chloride, 1-decyl-3-methylimidazolium bromide, 1-dodecyl-3-methylimidazolium chloride, 1-tetradecyl-3-methylimidazolium chloride, 1-ethyl-3-methylimidazolium tetrafluoroborate, 1-butyl-3-methylimidazolium tetrafluoroborate, 1-hexyl-3-methylimidazolium tetrafluoroborate, 1-ethyl-3-methylimidazolium hexafluorophosphate, 1-butyl-3-methylimidazolium hexafluorophosphate, 1-methyl-3-butylimidazolium methylsulfate, and 1,3-dibutylimidazolium methylsulfate. Among these, [1-butyl-3-(2-hydroxyethyl)imidazolium bromide] and [1-butyl-3-(2-hydroxyethyl)imidazolium tetrafluoroborate] are preferred.

Preferably, the ionic liquid has an electrical conductivity of $10^{-7}$ S/cm or more, more preferably $10^{-6}$ S/cm or more. When the electrical conductivity falls within the above range, the ionic liquid can effectively prevent reduction in the electrical conductivity between thermoelectric semiconductor fine particles, serving as a conductive assistant.

Also preferably, the decomposition temperature of the ionic liquid is 300° C. or higher. When the decomposition temperature falls within the above range, the ionic liquid can still maintain the effect thereof as a conductive assistant even when the thermoelectric conversion material layer of the thermoelectric semiconductor composition is annealed, as described below.

Preferably, the mass reduction in the ionic liquid at 300° C. in thermogravimetry (TG) is 10% or less, more preferably 5% or less, even more preferably 1% or less. When the mass reduction falls within the above range, the ionic liquid can still maintain the effect thereof as a conductive assistant even when the thin film of the thermoelectric semiconductor composition is annealed, as described below.

The blending amount of the ionic liquid in the thermoelectric semiconductor composition is preferably 0.01 to 50% by mass, more preferably 0.5 to 30% by mass, even more preferably 1.0 to 20% by mass. The blending amount of the ionic liquid falling within the above range provides a film capable of effectively preventing electrical conductivity reduction and having high thermoelectric performance.

(Inorganic Ionic Compound)

The inorganic ionic compound for use in the present invention is a compound composed of at least a cation and an anion. The inorganic ionic compound is solid at room temperature and has a melting point at any temperature falling within a temperature range of 400 to 900° C. and is characterized by having a high ionic conductivity, and therefore, serving as a conductive assistant, the compound can prevent reduction in the electrical conductivity between thermoelectric semiconductor fine particles.

A metal cation is used as the cation.

Examples of the metal cation include an alkali metal cation, an alkaline earth metal cation, a typical metal cation and a transition metal cation, and an alkali metal cation or an alkaline earth metal cation is more preferred.

Examples of the alkali metal cation include $Li^+$, $Na^+$, $K^+$, $Rb^+$, $Cs^+$ and $Fr^+$.

Examples of the alkaline earth metal cation include $Mg^{2+}$, $Ca^{2+}$, $Sr^{2+}$ and $Ba^{2+}$.

Examples of the anion include F, $Cl^-$, $Br^-$, $I^-$, $OH^-$, $CN^-$, $NO_3^-$, $NO_2^-$, $ClO^-$, $ClO_2^-$, $ClO_3$, $Cl_4^-$, $CrO_4^{2-}$, $HSO_4^-$, $SCN^-$, $BF_4^-$, and $PF_6^-$.

As the inorganic ionic compound, known or commercially-available ones can be used. Examples thereof include those composed of a cation component such as a potassium cation, a sodium cation or a lithium cation, and an anion component, e.g., a chloride ion such as $Cl^-$, $AlCl_4^-$, $Al_2Cl_7^-$, or $ClO_4^-$, a bromide ion such as $Br^-$, an iodide ion such as $I^-$, a fluoride ion such as $BF_4^-$ or $PF_6^-$, a halide anion such as $F(HF)_n^-$, or any other anion component such as $NO_3^-$, $OH^-$, or $CN^-$.

Among the above-mentioned inorganic ionic compounds, those having at least one selected from potassium, sodium and lithium as the cation component are preferred from the viewpoint of securing high-temperature stability and compatibility between thermoelectric semiconductor fine particles and resin, and from the viewpoint of preventing reduction in the electrical conductivity between thermoelectric semiconductor fine particles. Also preferably, the anion component of the inorganic ionic compound contains a halide anion, more preferably at least one selected from $Cl^-$, $Br^-$ and $I^-$.

Specific examples of the inorganic ionic compound having a potassium cation as the cation component include KBr, KI, KCl, KF, KOH, and $K_2CO_3$. Among these, KBr and KI are preferred.

Specific examples of the inorganic ionic compound having a sodium cation as the cation component include NaBr, NaI, NaOH, NaF, and $Na_2CO_3$. Among these, NaBr and NaI are preferred.

Specific examples of the inorganic ionic compound having a lithium cation as the cation component include LiF, LiOH, and $LiNO_3$. Among these, LiF and LiOH are preferred.

Preferably, the above inorganic ionic compound has an electrical conductivity of $10^{-7}$ S/cm or more, more preferably $10^{-6}$ S/cm or more. When the electrical conductivity falls within the above range, the inorganic ionic compound serving as a conductive assistant can effectively prevent reduction in the electrical conductivity between the thermoelectric semiconductor fine particles.

Also preferably, the decomposition temperature of the inorganic ionic compound is 400° C. or higher. When the decomposition temperature falls within the above range, the inorganic ionic compound can still maintain the effect thereof as a conductive assistant even when the thin film of the thermoelectric semiconductor composition is annealed, as described below.

Preferably, the mass reduction in the inorganic ionic compound at 400° C. in thermogravimetry (TG) is 10% or less, more preferably 5% or less, even more preferably 1% or less. When the mass reduction falls within the above range, the ionic liquid can still maintain the effect thereof as a conductive assistant even when the thin film of the thermoelectric semiconductor composition is annealed, as described below.

The blending amount of the inorganic ionic compound in the thermoelectric semiconductor composition is preferably 0.01 to 50% by mass, more preferably 0.5 to 30% by mass, even more preferably 1.0 to 10% by mass. When the blending amount of the inorganic ionic compound falls within the above range, the electrical conductivity can be effectively prevented from lowering and, as a result, a film having an improved thermoelectric performance can be realized.

In the case where the inorganic ionic compound and the ionic liquid are used together, the total content of the inorganic ionic compound and the ionic liquid in the thermoelectric semiconductor composition is preferably 0.01 to 50% by mass, more preferably 0.5 to 30% by mass, even more preferably 1.0 to 10% by mass.

(Other Additives)

The thermoelectric semiconductor composition for use in the present invention may further contain, as needed, other additives such as a dispersant, a film-forming aid, a light stabilizer, an antioxidant, a tackifier, a plasticizer, a colorant, a resin stabilizer, a filler, a pigment, an electroconductive filler, an electroconductive polymer and a curing agent, in addition to the above-mentioned components. One alone or two or more kinds of these additives may be used either singly or as combined.

(Method for Preparing Thermoelectric Semiconductor Composition)

The method for preparing the thermoelectric semiconductor composition for use in the present invention is not specifically defined. The thermoelectric semiconductor composition may be prepared by mixing and dispersing the above-mentioned thermoelectric semiconductor fine particles, the above-mentioned heat-resistant resin, and one or both of the above-mentioned ionic liquid and inorganic ionic compound, optionally along with any other additives and also with a solvent added thereto, according to a known method using an ultrasonic homogenizer, a spiral mixer, a planetary mixer, a disperser, or a hybrid mixer.

Examples of the solvent include toluene, ethyl acetate, methyl ethyl ketone, alcohols, tetrahydrofuran, methylpyrrolidone, and ethyl cellosolve. One alone or two or more different types of these solvents may be used here either singly or as combined. The solid concentration of the thermoelectric semiconductor composition is not specifically defined so far as the composition may have a viscosity suitable for coating operation.

A thermoelectric conversion material layer of the thermoelectric semiconductor composition may be formed by applying the thermoelectric semiconductor composition onto the sacrificial layer formed in the present invention and drying it thereon. According to the formation method, a large-area thermoelectric conversion material layer can be formed in a simplified manner at a low cost, and as a result, according to the production method for a chip of a thermoelectric conversion material layer of the present invention, a large amount of chips of a thermoelectric conversion material can be produced at a time.

The method of applying the thermoelectric semiconductor composition to a substrate is not specifically defined, for which employable is any known method of screen printing, flexographic printing, gravure printing, spin coating, dip coating, die coating, spray coating, bar coating, or doctor blade coating. In the case where the coating film is pattern-like formed, preferably employed is screen printing, stencil printing or slot die coating that realizes patterning in a simplified manner using a screen having a desired pattern.

Next, the resultant coating film is dried to give a thin film. As the drying method, employable is any known drying method such as hot air drying, hot roll drying, or IR radiation. The heating temperature is generally 80 to 150° C., and the heating time is generally a few seconds to several tens of minutes though it varies depending on the heating method.

In the case where a solvent is used in preparing the thermoelectric semiconductor composition, the heating temperature is not specifically defined so far as it falls within a temperature range capable of removing the used solvent through vaporization.

Not specifically limited, the thickness of the thin film of a thermoelectric semiconductor composition is, from the viewpoint of thermoelectric performance and film strength, preferably 100 nm to 1000 μm, more preferably 300 nm to 600 μm, even more preferably 5 to 400 μm.

(C) Annealing Step

In the present invention, the thermoelectric conversion material layer is annealed, after formed. The annealing treatment stabilizes thermoelectric performance, and promotes crystal growth of thermoelectric semiconductor fine particles in the thermoelectric conversion material layer and therefore further improves thermoelectric performance.

The annealing step is a step of heat-treating the thermoelectric conversion material layer formed on the sacrificial layer on a substrate, at a predetermined temperature, and, for example as in FIG. 1(b), this is a step of annealing the thermoelectric conversion material layer 3 of a thermoelectric semiconductor composition on the sacrificial layer 2.

Not specifically limited, the annealing treatment is generally carried out in an inert gas atmosphere of nitrogen, argon or the like or a reducing gas atmosphere in which the gas flow rate is controlled, or in vacuum, and depending on the heat-resistant temperature of the heat-resistant resin, the ionic liquid and the inorganic ionic compound to be used and also the resin and the release agent for the sacrificial layer, the annealing treatment is carried out generally at 100 to 600° C. for a few minutes to several tens of hours, preferably at 150 to 600° C. for a few minutes to several tens of hours, more preferably at 250 to 600° C. for a few minutes to several tens of hours, even more preferably at 250 to 450° C. for a few minutes to several tens of hours.

(D) Thermoelectric Conversion Material Layer Transferring Step

The production method for a chip of a thermoelectric conversion material of the present invention includes a thermoelectric conversion material layer transferring step.

In the thermoelectric conversion material layer transferring step, for the purpose of transferring a thermoelectric conversion material layer, and then individualizing the thermoelectric conversion material layer into chips of a thermoelectric conversion material, and facilitating peeling of the chips after individualized, preferably, a substrate having a pressure-sensitive adhesive layer is used.

The thermoelectric conversion material layer transferring step is a step of transferring the annealed thermoelectric conversion material layer on a sacrificial layer to a pressure-sensitive adhesive layer, and for example, as in FIG. 1(c), the pressure-sensitive adhesive layer 11b on the substrate 11a that constitutes a dicing sheet 11 is attached to the thermoelectric conversion material layer 3, and then, as in FIG. 1(d), the thermoelectric conversion material layer 3 is peeled from the sacrificial layer 2 and the resultant thermoelectric conversion material layer 3 is transferred to the pressure-sensitive adhesive layer 11b.

The method of bonding the thermoelectric conversion material layer to the pressure-sensitive adhesive layer is not specifically limited, and can be carried out according to a known technique.

The sacrificial layer peeling method is not also specifically limited so far as, in the method, the annealed thermoelectric conversion material layer can be peeled from a release layer in a state maintaining the shape and the properties thereof and the method can be carried out according to a known technique.

(Pressure-sensitive Adhesive Layer)

Not specifically limited, the pressure-sensitive adhesive to constitute the pressure-sensitive adhesive layer in the present invention may be any one ordinarily used in a dicing sheet, and examples thereof include rubber-based, acrylic, silicone-based, and polyvinyl ether-based pressure-sensitive adhesive agents. In addition, energy ray-curable (including UV-curable), or thermally-foamable, or thermally-curable pressure-sensitive adhesives are also usable. When energy of UV rays or heat is given to such pressure-sensitive adhesives, the adhesive strength between the pressure-sensitive adhesive layer and the chip of a thermoelectric conversion material can be lowered and the chip of a thermoelectric conversion material can be readily peeled.

The thickness of the pressure-sensitive adhesive layer is generally 3 to 100 μm, preferably 5 to 80 μm.

(Substrate)

The substrate for use in the present invention includes polyolefin-based films such as polyethylene films such as low-density polyethylene (LDPE) films, linear low-density polyethylene (LLDPE) films and high-density polyethylene (HDPE) films, polypropylene films, ethylene-propylene copolymer films, polybutene films, polybutadiene films, polymethylpentene films, ethylene-norbornene copolymer films, and norbornene resin films; ethylene-based copolymer films such as ethylene-vinyl acetate copolymer films, ethylene-(meth)acrylic acid copolymer films, and ethylene-(meth)acrylate copolymer films; polyvinyl chloride-based films such as polyvinyl chloride films, and vinyl chloride copolymer films; polyester-based films such as polyethylene terephthalate films, and polybutylene terephthalate films; polyurethane films; polyimide films; polystyrene films; polycarbonate films; and fluororesin films. Also usable here are modified films such as crosslinked films and ionomer films. Further, the substrate may also be a laminate film prepared by laminating a plurality of the above-mentioned films. In this description, "(meth)acrylic acid" means both acrylic acid and methacrylic acid. The same applied to the other similar terms.

In the case of a laminate film, for example, it is preferable that a film whose arithmetic average roughness varies before and after heating is arranged on the back side of the substrate, and a film which is resistant to heat and does not deform even at a high temperature is arranged on the side of the pressure-sensitive adhesive layer of the substrate.

Among the above, polyolefin-based films are preferred, and in particular, polyethylene films, polypropylene films and ethylene-propylene copolymer films are preferred, and further ethylene-propylene copolymer films are preferred. These resin films can readily satisfy the above-mentioned properties and in particular, ethylene-propylene copolymer films can be readily made to satisfy the above-mentioned properties by controlling the copolymerization ratio of the ethylene monomer and the propylene monomer. These resin films are also preferred from the viewpoint of workpiece adhesion operability and chip peelability.

If desired, the resin film may be surface-treated according to an oxidation method or a surface roughening method or may be primer-treated on one surface or both surfaces thereof, for the purpose of improving the adhesiveness between the film and the pressure-sensitive adhesive layer to be laminated thereon. Examples of the oxidation method include corona discharge treatment, plasma discharge treatment, chromium oxidation treatment (wet process), flame treatment, hot air treatment, and ozone or UV ray irradiation treatment. Examples of the surface roughening method include a sandblasting method and a thermal spraying treatment.

The substrate may contain various additives, such as a colorant, a flame retardant, a plasticizer, an antistatic agent, a lubricant and a filler, in the resin film.

The thickness of the substrate is not specifically limited so far as he substrate can appropriately function in each step using a dicing sheet, and is preferably 20 to 450 μm, more preferably 25 to 400 μm, even more preferably 50 to 350 μm.
(E) Step of Individualizing Chips of Thermoelectric Conversion Material The production method for a chip of a thermoelectric conversion material of the present invention incudes a step of individualizing chips of a thermoelectric conversion material. The step of individualizing chips of a thermoelectric conversion material is a step of individualizing the thermoelectric conversion material layer transferred to the pressure-sensitive adhesive layer into chips of the thermoelectric conversion material, and for example, as in FIG. 1(e) or (e), this is a step of individualizing the resultant thermoelectric conversion material layer 3 or the thermoelectric conversion material layer 3 having a solder-receiving layer 4 to be mentioned below, into chips. FIG. 1(f) is a cross-sectional view showing an embodiment of individualizing the thermoelectric conversion material layer 3 having a solder-receiving layer 4 into chips, using a dicing blade 12.

The method of individualizing the thermoelectric conversion material layer into chips is not specifically limited, and can be carried out in any known method, but from the viewpoint of working accuracy and process stability, preferably, a dicing blade or a laser is used.

The dicing blade for use in dicing is generally a rotary blade having a sintered diamond powder in the outer periphery of the disc (diamond cutter). For individualization according to a dicing method, for example, the thermoelectric conversion material layer to be an object to be cut is fixed on a working bed via a jig, and the above-mentioned dicing blade is driven in a state having a space for inserting the dicing blade thereinto between the cutting region of the thermoelectric conversion material layer and the jig.

The laser is not specifically limited, and examples thereof include a solid laser such as a YAG laser, a glass laser, and a ruby laser; a vapor laser such as a $CO_2$ laser, a He-Ne laser, an Ar ion laser, a KR ion laser, a CO laser, a He-Cd laser, an $N_2$ laser, and an excimer laser; a semiconductor laser such as an InGaP laser, an AlGsAs laser, a GaAsP laser, an InGaAs laser, an InAsP laser, a $CdSnP_2$ laser, and a GaSb laser; a chemical laser, and a dye laser. Among these, from the viewpoint of working accuracy and mass productivity, a YAG laser and a $CO_2$ laser are preferred.

(Solder-Receiving Layer Forming Step 1)

Preferably, from the viewpoint of enhancing the bonding strength between the resultant thermoelectric conversion material layer and the solder layer on the electrode, the present invention further includes a solder-receiving layer forming step 1 on the transferred thermoelectric conversion material layer 1, or on the individualized thermoelectric conversion material chips, or on the peeled thermoelectric conversion material chips.

The solder-receiving layer forming step 1 is, for example, as in FIG. 1(e'), a step of forming a solder-receiving layer 4 on the thermoelectric conversion material layer 3.

Preferably, the solder-receiving layer contains a metal material. The metal material is preferably at least one selected from gold, silver, aluminum, rhodium, platinum, chromium, palladium, tin, and an alloy containing any of these metal materials. Among these, gold, silver, aluminum, or a two-layer structure of tin and gold is more preferred, and from the viewpoint of material cost, high thermal conductivity and bonding stability, silver and aluminum are even more preferred.

Further, the solder-receiving layer may also be formed using a paste material that contains a solvent and a resin component, in addition to the metal material. In the case of using a paste material, preferably, the solvent and the resin component are removed by firing or the like, as described below. As the paste material, a silver paste or an aluminum paste is preferred. In addition, a metal resinate material can also be used as the solder-receiving layer.

The thickness of the solder-receiving layer is preferably 10 nm to 50 μm, more preferably 50 nm to 16 μm, even more preferably 200 nm to 4 μm, especially more preferably 500 nm to 3 μm. When the thickness of the solder-receiving layer falls within the range, the adhesiveness to the surface of the chip of a thermoelectric conversion material containing a resin and the adhesiveness to the surface of the solder layer on the electrode side are excellent and high-reliability bonding can be attained. In addition, not only electroconductivity but also thermal conductivity can be kept high, therefore resulting in that the thermoelectric performance of the thermoelectric conversion module is not lowered and is kept good.

The solder-receiving layer may be a single layer of the above-mentioned metal material used directly as such, or two or more metal materials may be laminated to be a multilayer. Also, a composition containing the metal material in a solvent or a resin may be used for forming the layer. However, in this case, from the viewpoint of maintaining high electroconductivity and high thermal conductivity (maintaining thermoelectric performance), preferably, the resin component including a solvent is removed by firing as the final form of the solder-receiving layer.

The solder-receiving layer is formed using the above-mentioned metal material.

As a method for forming a solder-receiving layer as a pattern, employable herein is a method that includes forming a thermoelectric conversion material layer, or an unpatterned solder-receiving layer on a chip of a thermoelectric conversion material, and then patterning the layer to have a predetermined pattern by known physical treatment or chemical treatment or a combination thereof mainly based on photolithography, or a method of directly forming a pattern of a solder-receiving layer according to a screen printing method, a stencil printing method or an inkjet method.

As a method for forming a solder-receiving layer that does not require patterning, employable herein is a vacuum film formation method such as PVD (physical vapor deposition) such as a vacuum evaporation method, a sputtering method, or an ion-plating method, or CVD (chemical vapor deposition) such as thermal CVD or atomic layer deposition (ALD), or a wet process of various coating or electrodeposition methods such as a dip coating method, a spin coating method, a spray coating method, a gravure coating method, a die coating method or a doctor blade method, as well as a silver salt method, an electrolytic plating method, an electroless plating method, or lamination of metal foils; and the method may be appropriately selected depending on the material of the solder-receiving layer.

In the present invention, the solder-receiving layer is required to have high electroconductivity and high thermal conductivity from the viewpoint of maintaining thermoelectric performance, and therefore a solder-receiving layer formed according to a screen printing method, a stencil printing method, an electrolytic plating method, an electroless plating method or a vacuum film formation method is preferably used.

In the case where a solder-receiving layer is formed on the peeled chips of a thermoelectric conversion material, preferably, the solder-receiving layer is formed on the entire surface of the chip of a thermoelectric conversion material.

For the method of forming the solder-receiving layer on the entire surface of the chip of a thermoelectric conversion material, employable are a wet process such as a dip coating method, a spray coating method and an electrodeposition method, and a silver salt method, an electrolytic plating method and an electroless plating method, and depending on the material of the solder-receiving layer to be formed, the method can be appropriately selected.

(F) Thermoelectric Conversion Material Chip Peeling Step

The production method for a chip of a thermoelectric conversion material of the present invention includes a thermoelectric conversion material chip peeling step. The thermoelectric conversion material chip peeling step is a step of taking out the individualized chips of a thermoelectric conversion material on the pressure-sensitive adhesive layer in the form of chips of the thermoelectric conversion material, and for example, as in FIG. 1(g), this is a step of peeling individualized plural chips 3 of a thermoelectric conversion material having the solder-receiving layer 4 on the pressure-sensitive adhesive layer 11b, from the pressure-sensitive adhesive layer 11b.

From the viewpoint of readily peeling the individualized plural chips of a thermoelectric conversion material on the pressure-sensitive adhesive layer, from the pressure-sensitive adhesive layer, preferably, the step includes a step of irradiating the pressure-sensitive adhesive layer of the above-mentioned pressure-sensitive adhesive whose adhesive strength can lower through irradiation with energy ray, with energy layer before peeling, to thereby lower the adhesive strength of the pressure-sensitive adhesive layer to the thermoelectric conversion material or to the thermoelectric conversion material chips.

The energy ray incudes an ionizing radiation, that is, UV rays, electron beams and X rays. Among these, from the viewpoint of cost, safety and easiness in equipment installation, UV rays are preferred.

In the case where UV rays are used as the ionizing radiation, near-UV rays including UV rays having a wavelength of 200 to 380 nm or so are preferably used from the viewpoint of easy operability. The light quantity may be appropriately selected depending on the kind of the energy ray-curable component contained in the pressure-sensitive adhesive composition and on the thickness of the pressure-sensitive adhesive layer, and is generally 50 to 500 mJ/cm$^2$ or so, preferably 100 to 450 mJ/cm$^2$, more preferably 200 to 400 mJ/cm$^2$. The UV illumination is generally 50 to 500 mW/cm$^2$ or so, preferably 100 to 450 mW/cm$^2$, more preferably 200 to 400 mW/cm$^2$. The UV ray source is not specifically limited, and examples thereof include a high-pressure mercury lamp, a metal halide lamp and a UV-LED.

In the case where electron beams are used as the ionizing radiation, the acceleration voltage thereof may be appropriately selected depending on the kind of the energy ray-curable component contained in the pressure-sensitive adhesive composition and on the thickness of the pressure-sensitive adhesive layer, and in general, the acceleration voltage is preferably 10 to 1000 kV or so. The irradiation dose may be set to fall within a range within which the pressure-sensitive adhesive can cure, and in general, it is selected to fall within a range of 10 to 1000 krad. The electron beam source is not specifically limited, and examples thereof include various electron beam accelerators such as a Cockroft-Walton's accelerator, a Van de Graaff accelerator, a resonance transformer, an insulation core transformer, or a linear, dynamitron or high-frequency accelerator.

According to the production method for a chip of a thermoelectric conversion material layer of the present invention, a chip of a thermoelectric conversion material can be produced in a simple manner. In the method, a thermoelectric conversion material is not annealed while bonded to an electrode, and therefore, as mentioned above, the method is free from a problem of increasing the electric resistance value between the thermoelectric conversion material and an electrode to degrade thermoelectric performance.

[Production Method for Thermoelectric Conversion Module]

The production method for a thermoelectric conversion module of the present invention is a method for producing a thermoelectric conversion module of a combination of plural chips of a thermoelectric conversion material produced in the above-mentioned production method for a chip of a thermoelectric conversion material.

Preferably, from the viewpoint of thermoelectric performance, the thermoelectric conversion module is produced in such a manner that chips of a P-type thermoelectric conversion material and chips of an N-type thermoelectric conversion materials are mounted (arranged) so as to be connected via an electrode to have a configuration of a so-called n-type or in-plane type thermoelectric conversion module to be mentioned below.

In the case of configuring a it-type thermoelectric conversion module, for example, a pair of electrodes spacing from each other are provided on a substrate, a chip of a P-type thermoelectric conversion material is arranged on one electrode and a chip of an N-type thermoelectric conversion material is on the other electrode similarly as space from each other, and the upper faces of those chips of a thermoelectric conversion material are electrically connected in series to the electrode on a facing substrate, and hence, the intended module is configured. From the viewpoint of efficiently attaining high-level thermoelectric performance, preferably, plural pairs of a chip of a P-type thermoelectric conversion material and a chip of a N-type thermoelectric conversion material, each combined via the electrode on the facing substrate, are electrically connected in series (see FIG. 2(g) to be mentioned below).

Similarly, in the case of constituting an in-plane-type thermoelectric conversion module, for example, one electrode is provided on a substrate, and a chip of a P-type thermoelectric conversion material is formed on the surface of the electrode and a chip of an N-type thermoelectric conversion material is similarly formed on the surface of the electrode in such a manner that the sides of the two chip (for example, the faces in a vertical direction to the substrate) could be in contact with each other or could be spaced from each other, and the chips are electrically connected in series via the electrode in the in-plane direction of the substrate (for example, in the case of a configuration for power generation, a pair of electrodes for taking out electromotive force are additionally used). From the viewpoint of efficiently achieving high-level thermoelectric performance, preferably in the configuration, a same number of plural chips of a P-type thermoelectric conversion material and plural chips of an N-type thermoelectric conversion material are alternately electrically connected in series via an electrode in the in-plane; direction of the substrate.

One preferred embodiment of the method for producing a n-type thermoelectric conversion module of a combination of plural chips of a thermoelectric conversion material produced in the production method for a chip of a thermoelectric conversion material of the present invention includes the following steps (i) to (vi).

(i) a step of forming a first electrode on a first resin film, (ii) a step of forming a second electrode on a second resin film, (iii) a step of forming a bonding material layer 1 on the first electrode formed in the step (i), (iv) a step of mounting one surface of the chip of a thermoelectric conversion material on the bonding material layer 1 formed in the step (iii), (v) a step of bonding one surface of the chip of a thermoelectric conversion material mounted in the step (iv) to the first electrode via the bonding material layer 1 formed in the step (iii), and (vi) a step of bonding the other surface of the chip of a thermoelectric conversion material after the step (v) to the second electrode formed in the step (ii) via a bonding material layer 2.

Next, one preferred embodiment of the method for producing a π-type thermoelectric conversion module of a combination of plural chips of a thermoelectric conversion material each having a solder-receiving layer as produced in the production method for a chip of a thermoelectric conversion material of the present invention includes the following steps (xi) to (xvii).

(xi) a step of forming a first electrode on a first resin film, (xii) a step of forming a second electrode on a second resin film, (xiii) a step of forming a solder material layer on the first electrode formed in the step (xi), (xiv) a step of mounting one surface of the chip of a thermoelectric conversion material having a solder-receiving layer on the solder material layer formed in the step (xiii), (xv) a step of bonding one surface of the chip of a thermoelectric conversion material having a solder-receiving layer mounted in the step (xiv) to the first electrode via the solder material layer formed in the step (xiii), and (xvi) a step of forming a solder-receiving layer on the other surface of the chip of a thermoelectric conversion material after the step (xv);

(xvii) a step of bonding the solder-receiving layer on the other surface of the chip of a thermoelectric conversion material after the step (xvi) to the second electrode formed in the step (xii) via the solder material layer.

One preferred embodiment of the method for producing an in-plane-type thermoelectric conversion module of a combination of plural chips of a thermoelectric conversion material produced according to the production method for a chip of a thermoelectric conversion material of the present invention includes the following steps (I) to (V).

(I) a step of forming a first electrode on a first resin film, (II) a step of forming a bonding material layer 1 on the first electrode formed in the step (I), (III) a step of mounting one surface of the chip of a thermoelectric conversion material on the bonding material layer 1 formed in the step (II), (IV) a step of bonding one surface of the chip of a thermoelectric conversion material mounted in the step (III) to the first electrode via the bonding material layer 1 formed in the step (II), and (V) a step of bonding the other surface of the chip of a thermoelectric conversion material after the step (IV) to a resin film via a bonding material layer 3.

Next, one preferred embodiment of the method for producing an in-plane-type thermoelectric conversion module of a combination of plural chips of a thermoelectric conversion material each having a solder-receiving layer as produced according to the production method for a chip of a thermoelectric conversion material of the present invention includes the following steps (XI) to (XV).

(XI) a step of forming a first electrode on a first resin film, (XII) a step of forming a solder material layer on the first electrode formed in the step (XI), (XIII) a step of mounting one surface having a solder-receiving layer of the chip of a thermoelectric conversion material, on the solder material layer formed in the step (XII), (XIV) a step of bonding one surface having a solder-receiving layer of the chip of a thermoelectric conversion material mounted in the step (XIII), to the first electrode via the solder material layer formed in the step (XII), and (XV) a step of bonding the other surface of the chip of a thermoelectric conversion material after the step (XIV), to a resin film via a bonding material layer 3.

Hereinunder the production method for a thermoelectric conversion module using the chip of a thermoelectric conversion material produced according to the production method for a chip of a thermoelectric conversion material of the present invention is described with reference to drawings.

Figure 2:
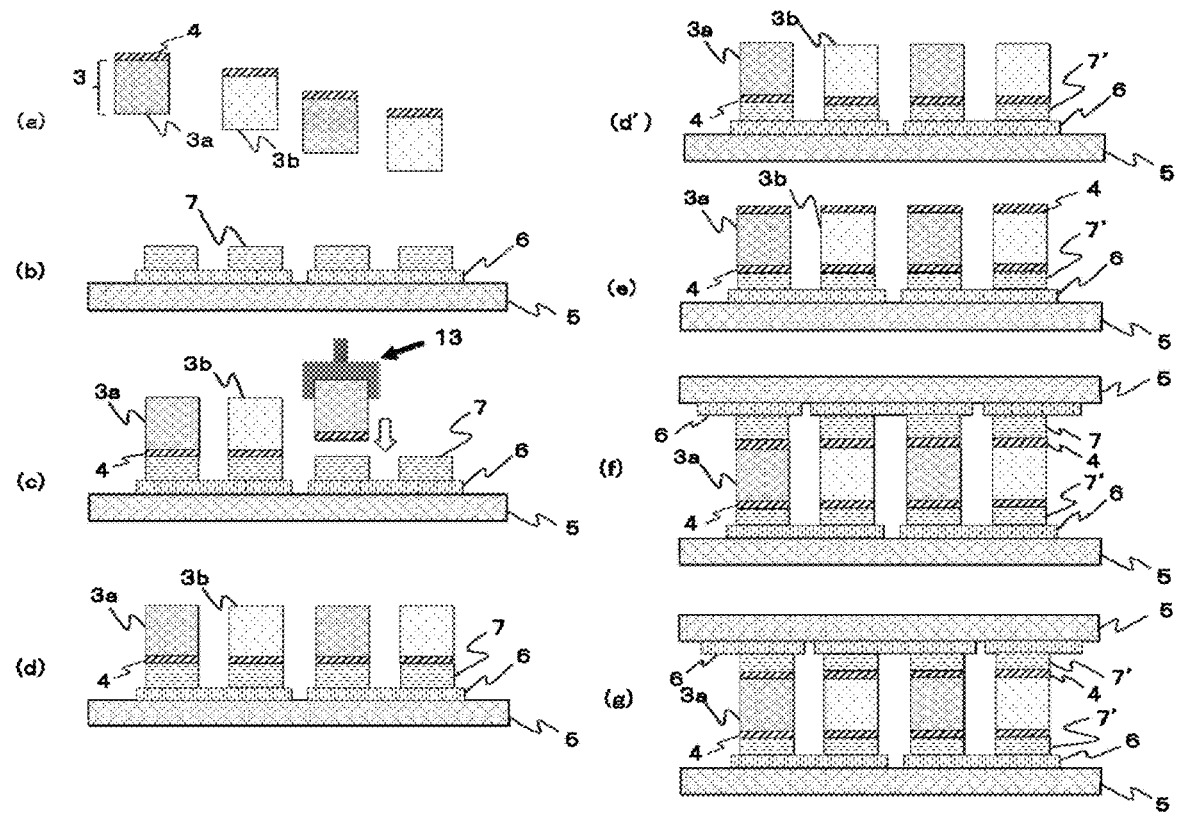
FIG. 2 is an explanatory view showing a flow of an example of a process according to the production method for a thermoelectric conversion module using the chip of a thermoelectric conversion material produced according to the production method for a chip of a thermoelectric conversion material of the present invention.

FIG. 2 is an explanatory view showing a flowchart of an example of a step according to a method for producing a thermoelectric conversion module using the chip of a thermoelectric conversion material produced according to the method for producing a chip of a thermoelectric conversion material of the present invention, in which (a) is a cross-sectional view of a chip of a thermoelectric conversion material having a solder-receiving layer on one surface of the individualized thermoelectric conversion material chip produced according to the production method for a chip of a thermoelectric conversion material mentioned above; (b) is a cross-sectional view after an electrode and a solder layer are formed on a resin film; (c) is a cross-sectional view showing an embodiment of mounting the chip of a thermoelectric conversion material having a solder-receiving layer, on the solder layer on the electrode on the resin film formed in (b); (d) is a cross-sectional schematic view showing an embodiment after a chip of a thermoelectric conversion material is mounted, (d') is a cross-sectional view after bonding the solder layer by heating and cooling, (e) is a cross-sectional view after forming a solder-receiving layer on the other surface of the chip of a thermoelectric conversion material in (d'); (f) is a cross-sectional view after bonding the solder layer on the electrode on the resin film formed in (b), to the solder-receiving layer of the chip of a thermoelectric conversion material formed in (e); and (g) is a cross-sectional view after bonding the chip of a thermoelectric conversion material having the solder-receiving layer to the electrode by heating and cooling the solder layer used in (f).

<Electrode Forming Step>

The electrode forming step is a step of the production method for a thermoelectric conversion module of the present invention, for example, a step of forming a first electrode on a first resin film in the above step (i), or for example, a step of forming a second electrode on a second resin film in the above step (ii), or for example, a step of forming a metal layer on a resin film 5 and patterning the layer in a predetermined manner to form an electrode 6 in FIG. 2(*b*).

(Resin Film)

In the production method for a thermoelectric conversion module of the present invention, preferably, a first resin film and a second resin film not having any influence on reduction in the electrical conductivity of a thermoelectric conversion material and on increase in thermal conductivity are used. Above all, from the viewpoint of excellent flexibility and high-level heat resistance and dimensional stability in that, even in annealing of a thin film of a thermoelectric semiconductor composition, chip performance of a thermoelectric conversion material can be maintained without causing substrate deformation, the resin film is each independently preferably a polyimide film, a polyamide film, a polyether imide film, a polyaramid film, or a polyamideimide film, and from the viewpoint of high-level general versatility, a polyimide film is especially preferred.

The thickness of the first resin film and the second resin film is, from the viewpoint of flexibility, heat resistance and dimensional stability, each independently preferably 1 to 1000 μm, more preferably 5 to 500 μm, and even more preferably 10 to 100 μm.

Also preferably, the 5% weight-loss temperature of the first resin film and the second resin film, as measured in thermogravimetry, is 300° C. or higher, more preferably 400° C. or higher. Also preferably, the rate of dimensional change in heating thereof, as measured at 200° C. according to JIS K7133 (1999), is 0.5% or less, more preferably 0.3% or less. Also preferably, the linear expansion coefficient in the in-plane direction thereof, as measured according to JIS K7197 (2012), is 0.1 ppm·° C.$^{-1}$ to 50 ppm·° C.$^{-1}$, more preferably 0.1 ppm·° C.$^{-1}$ to 30 ppm·° C.$^{-1}$.

(Electrode)

The metal material for the electrode in the thermoelectric conversion module of the present invention is copper, gold, nickel, aluminum, rhodium, platinum, chromium, palladium, stainless steel, molybdenum or an alloy containing any of these metals.

The thickness of the electrode layer (thickness of the metal material layer) is preferably 10 nm to 200 μm, more preferably 30 nm to 150 μm, even more preferably 50 nm to 120 μm. When the thickness of the electrode layer falls within the range, the electrical conductivity thereof can be high and the resistance can be low and the electrode layer can have a sufficient strength.

For electrode formation, the above-mentioned metal material is used.

For the electrode formation method, employable is a method that includes forming an unpatterned electrode on a resin film, and then patterning it to have a predetermined pattern by known physical treatment or chemical treatment or a combination thereof mainly based on photolithography, or a method of directly forming a pattern of an electrode according to a screen printing method, or an inkjet method.

As the method for forming an unpatterned electrode, employable is a dry process such as PVD (physical vapor deposition) such as a vacuum evaporation method, a sputtering method, or an ion-plating method, or CVD (chemical vapor deposition) such as thermal CVD or atomic layer deposition (ALD), or a wet process of various coating or electrodeposition methods such as a dip coating method, a spin coating method, a spray coating method, a gravure coating method, a die coating method or a doctor blade method, as well as a silver salt method, an electrolytic plating method, an electroless plating method, or lamination of metal foils; and the method may be appropriately selected depending on the material of the electrode.

The electrode for use in the present invention is required to have high electroconductivity and high thermal conductivity from the viewpoint of maintaining thermoelectric performance, and is therefore preferably an electrode formed according to a plating method or a vacuum film formation method. Also preferred is an electrode formed according to a vacuum film formation method such as a vacuum evaporation method or a sputtering method, or an electrolytic plating method or an electroless plating method, as readily realizing high electroconductivity and high thermal conductivity. Depending on the dimension of the pattern to be formed and on the dimensional accuracy thereof, a pattern can be formed with ease via a hard mask such as a metal mask.

<Bonding Material Layer Forming Step>

The bonding material layer forming step is, for example, the step (iii) in the production method for a thermoelectric conversion module of the present invention, and is a step of forming a bonding material layer 1 on the first electrode.

Also for example, the step is included in the step (vi) and is a step of forming a bonding material layer 2 on the second electrode.

Specifically, for example, as in FIG. 2(b), this is a step of forming a solder material layer 7 on the electrode 6, and the bonding material layer 1 and the bonding material layer 2 are for bonding a chip of a thermoelectric conversion material to an electrode.

The bonding material includes a solder material, an electroconductive adhesive, and a sintering bond, and is preferably formed as a solder material layer, an electroconductive adhesive layer and a sintering bond layer, respectively, on an electrode. In this description, electroconductivity is meant to indicate that the electric resistivity is less than $1 \times 10^6$ Ω~m.

The solder material to constitute the solder layer may be appropriately selected in consideration of the heatproof temperature as well as the electroconductivity and the thermal conductivity of the heat-resistant resin contained in the resin film, and the chip of a thermoelectric conversion material, and includes known materials such as Sn, an Sn/Pb alloy, an Sn/Ag alloy, an Sn/Cu alloy, an Sn/Sb alloy, an Sn/In alloy, an Sn/Zn alloy, an Sn/In/Bi alloy, an Sn/In/Bi/Zn alloy, an Sn/Bi/Pb/Cd alloy, an Sn/Bi/Pb alloy, an Sn/Bi/Cd alloy, a Bi/Pb alloy, an Sn/Bi/Zn alloy, an Sn/Bi alloy, an Sn/Bi/Pb alloy, an Sn/Pb/Cd alloy, and an Sn/Cd alloy. From the viewpoint of lead-free and/or cadmium-free composition, melting point, electroconductivity and thermal conductivity, alloys such as a 43Sn/57Bi alloy, a 42Sn/58Bi alloy, a 40Sn/56Bi/4Zn alloy, a 48Sn/52In alloy, and a 39.8Sn/52In/7Bi/1.2Zn are preferred.

Examples of commercial products of solder materials usable here include a 42Sn/58Bi alloy (from Tamura Corporation, product name: SAM10-401-27), a 41Sn/58Bi/Ag alloy (from Nihon Handa Co., Ltd., product name: PF141-LT7HO), and a 96.5Sn3Ag0.5Cu alloy (from Nihon Handa Co., Ltd., product name: PF305-207BTO).

The thickness of the solder layer (after heated and cooled) is preferably 10 to 200 μm, more preferably 20 to 150 μm, even more preferably 30 to 130 μm, especially more preferably 40 to 120 μm. When the thickness of the solder layer falls within the range, adhesiveness between a chip of a thermoelectric conversion material and an electrode is readily attained.

The method of applying a solder material to a substrate may be any known method of stencil printing, screen printing or dispensing. The heating temperature varies depending on the solder material and the resin film, and is generally 150 to 280° C. for 3 to 20 minutes.

Not specifically limited, the electroconductive adhesive to constitute the electroconductive adhesive layer includes an electroconductive paste. The electroconductive paste includes a copper paste, a silver paste and a nickel paste.

In the case where a binder is used, the binder may be an epoxy resin, an acrylic resin or an urethane resin.

The method of applying an electroconductive adhesive to a resin film may be any known method of screen printing or dispensing.

The thickness of the electroconductive adhesive layer is preferably 10 to 200 μm, more preferably 20 to 150 μm, even more preferably 30 to 130 μm, further more preferably 40 to 120 μm.

Not specifically limited, the sintering bond to constitute the sintering bond layer includes a sintering paste. For example, the sintering paste is formed of a micron-size metal powder and a nano-size metal particles, and differing from the above-mentioned electroconductive adhesive, the sintering paste is to directly bond metal by sintering, and may contain a binder such as an epoxy resin, an acrylic resin or an urethane resin.

The sintering paste includes a silver sintering paste, and a copper sintering paste.

The method of applying a sintering boding agent to a resin film may be any known method of screen printing, stencil printing or dispensing. The sintering condition may vary depending on the metal material to be used, and is generally at 100 to 300° C. for 30 to 120 minutes.

Regarding commercial products of the sintering bond, for example, as a silver sintering paste, a sintering paste (product name, CT2700R7S, from Kyocera Corporation), and a sintering metal bonding material (product name, MAX102, by Nihon Hand Co., Ltd.) are usable.

The thickness of the sintering bond layer is preferably 10 to 200 μm, more preferably 20 to 150 μm, even more preferably 30 to 130 μm, especially preferably 40 to 120 μm.

The bonding material layer forming step may include a step of forming a bonding material layer 3. The bonding material layer 3 is used in the case of direct forming on a resin film not via an electrode, and is, for example, included in the step (V) or (XV) in the production method for an in-plane-type thermoelectric conversion module, and is a step of directly forming a bonding material layer 3 on a resin film. A resin material can be used for the bonding material. The resin material preferably contains a polyolefin-based resin, an epoxy resin, or an acrylic resin. Further, the resin material preferably has pressure-sensitive adhesiveness, low water vapor permeability, and insulation performance. In this description, pressure-sensitive adhesiveness means that a resin material has pressure-sensitive adhesiveness, or ordinary adhesiveness, or has temporal pressure-sensitive adhesiveness enabling adhesion under pressure at the initial stage of adhering. Also in this description, insulation performance means to have an electric resistivity of $1 \times 10^6$ Ω·m or more. The resin film may be the same as the above-mentioned first and second resin films.

<Thermoelectric Conversion Material Chip Mounting Step>

The thermoelectric conversion material chip mounting step is, for example, the step (iv) in the thermoelectric conversion module production method of the present invention, that is, a step of mounting one surface of the chip of a thermoelectric conversion material produced according to the production method for a chip of a thermoelectric conversion material mentioned above, on the bonding material layer 1 formed in the step (iii). For example, as in FIG. 2(c), this is a step of mounting the chip 3a of a P-type thermoelectric conversion material having the solder-receiving layer 4 and the chip 3b of an N-type thermoelectric conversion material having the solder-receiving layer 4, on the solder layer 7 on the electrode 6 on the resin film 5 so as to form a pair of those chips on the electrode 6, using a hand part 13 of a chip mounter (not shown). (After thus mounted, the chips are as in the embodiment of (d).)

Regarding the arrangement of the chip of a P-type thermoelectric conversion material and the chip of an N-type thermoelectric conversion material, those of the same type may be combined depending on the intended use, or the chips may be randomly combined, for example, like " . . . NPPN . . . " or " . . . PNPP . . . " From the viewpoint of achieving theoretically high thermoelectric performance, preferably, plural pairs of a chip of a P-type thermoelectric conversion material and a chip of an N-type thermoelectric conversion material are arranged via an electrode.

Not specifically limited, the method for mounting a chip of a thermoelectric conversion material on the bond material layer 1 may be any known method. For example, a method is employable, in which one or plural chips of a thermoelectric conversion material are handled with a chip mounter, and positioned using a camera, and mounted on the layer.

Preferably, the chip of a thermoelectric conversion material is mounted using a chip mounter from the viewpoint of handleability, positioning accuracy and mass-productivity.

<Bonding Step>

The bonding step is a step in the thermoelectric conversion module production method of the present invention, for example, the step (v) of bonding one surface of the chip of a thermoelectric conversion material mounted in the step (iv) to the above-mentioned first electrode via the above-mentioned bonding material layer 1 formed in the step (iii). For example, as in FIG. 2(c), this is a step of heating the solder layer 7 at a predetermined temperature, keeping it for a predetermined period of time and then restoring it to room temperature.

Also the step is, for example, the step (vi) in the thermoelectric conversion module production method of the present invention, that is, a step of bonding the other surface of the chip of a thermoelectric conversion material after the step (v) to the second electrode formed in the step (ii) via the bonding material layer 2. For example, as in FIG. 2(f), this is a step of bonding the surface of the solder-receiving layer 4 on the chip 3a of a P-type thermoelectric conversion material and the other surface of the solder-receiving layer 4 on the chip 3b of an N-type thermoelectric conversion material in (e) to the electrode 6 on the resin film 5, each via the solder layer 7. FIG. 2(g) shows an embodiment after the solder layer 7 in (f) is heated and cooled (solder layer T).

The heating temperature and the holding time of the bonding conditions are as mentioned above. FIG. 2(d') shows an embodiment after the solder layer 7 is restored to room temperature. (The solder layer 7' is solidified after heating and cooling and its thickness reduces.)

Preferably, the chip is bonded to the electrode via the above-mentioned bonding material, that is, via a solder material layer, an electroconductive adhesive layer or a sintering bond layer. In the case where a solder layer is used, preferably, the chip is bonded via a solder-receiving layer from the viewpoint of improving adhesiveness.

Preferably, the bonding step includes a step of bonding the other surface of the chip of a thermoelectric conversion material to a resin film not having an electrode, via the bonding material layer 3. For example, this is the above-mentioned step (V), and is a step of bonding the other surface of the chip of a thermoelectric conversion material after the step (IV), to a resin film via the bonding material layer 3. The bonding to a resin film can be carried out according to a known method.

A combination of bonding material layers to be on the electrodes on a pair of resin films in the thermoelectric conversion module (except the case where any of a pair of resin films does not have an electrode) is not specifically limited, but, from the viewpoint of preventing mechanical deformation of thermoelectric conversion modules so as to prevent degradation of thermoelectric performance, a combination of solder material layers, a combination of electro-conductive adhesive layers, or a combination of sintering bond layers is preferred.

(Solder-Receiving Layer Forming Step 2)

Preferably, the production method for a thermoelectric conversion module of the present invention further includes a solder-receiving layer forming step 2 of the above (xv), for example, on the other surface of the chip of a thermoelectric conversion material after the step (xv).

The solder-receiving layer forming step 2 is, for example, as in FIG. 2(e), a step of forming a solder-receiving layer on the chip 3a of a P-type thermoelectric conversion material and the chip 3b of an N-type thermoelectric conversion material. The forming step for the solder-receiving layer, the material to be used, the thickness and the forming method are as described above.

According to the production method for a chip of a thermoelectric conversion material, and the production method for a thermoelectric conversion material using the chip of the present invention, a chip of a thermoelectric conversion material can be formed in a simplified manner, and using the chip, a thermoelectric conversion module can be produced while preventing degradation of thermoelectric performance derived from formation of an alloy layer owing to diffusion between a thermoelectric conversion material and an electrode in the annealing step in a conventional process.

INDUSTRIAL APPLICABILITY

According to the production method for a chip of a thermoelectric conversion material of the present invention and according to the production method for a thermoelectric conversion module using the chip produced according to the chip production method, formation of an alloy layer owing to diffusion of an electrode and a thermoelectric conversion material can be prevented and, as a result, a problem of degradation of thermoelectric performance can be solved. Simultaneously, the improvement of yield in the production method is expected. Further, the thermoelectric conversion module produced according to the production method of the present invention is flexible and has a possibility of thinning the module (with down-sizing and weight reduction).

The thermoelectric conversion module using the chip produced according to the production method for a chip of a thermoelectric conversion material mentioned above is considered to be applicable to use for power generation for converting exhaust heat from various combustion furnaces in factories, waste combustion furnaces or cement combustion furnaces, or automobile combustion gas exhaust heat or electronics exhaust heat into electricity. Regarding cooling use, for example, the module can be used for temperature control for image sensors such as CPU (central processing unit), CMOS (complementary metal oxide semiconductor image sensor), and CCD (charge coupled device) for use in smartphones and various computers, and further for other various sensors for MEMS (micro electro mechanical systems), optical receivers and others, in the field of electronics instruments.

REFERENCE SIGNS LIST

1: Substrate
2: Sacrificial Layer
3: Thermoelectric Conversion Material Layer
3a: Chip of P-type Thermoelectric Conversion Material
3b: Chip of N-type Thermoelectric Conversion Material
4: Solder-Receiving Layer
5: Resin Film
6: Electrode
7: Solder Layer (during formation)
7: Solder Layer (after bonded)
11: Dicing Sheet
11a: Substrate
11b: Pressure-Sensitive Adhesive Layer
12: Dicing Blade
13: Hand Part

The invention claimed is:

1. A method for producing a chip of a thermoelectric conversion material formed of a thermoelectric semiconductor composition, the method comprising:
   (A) forming a sacrificial layer on a substrate,
   (B) forming a thermoelectric conversion material layer of a thermoelectric semiconductor composition on the sacrificial layer,
   (C) annealing the thermoelectric conversion material layer,
   (D) transferring the thermoelectric conversion material layer to a pressure-sensitive adhesive layer, such that the thermoelectric conversion material layer is in direct contact with the pressure-sensitive adhesive layer,
   (E) individualizing the thermoelectric conversion material layer into individual chips of a thermoelectric conversion material, and
   (F) peeling the chips of a thermoelectric conversion material.

2. The method according to claim 1, wherein the individualizing the thermoelectric conversion material layer into individual chips of a thermoelectric conversion material is carried out using a dicing blade or a laser.

3. The method according to claim 1, further comprising:
   irradiating the pressure-sensitive adhesive layer with energy ray to lower an adhesive strength of the pressure-sensitive adhesive layer to the thermoelectric conversion material layer or to the chip of a thermoelectric conversion material.

4. The method according to claim 1, wherein the sacrificial layer comprises a resin or a release agent.

5. The method according to claim 1, wherein a thickness of the sacrificial layer is from 10 nm to 10 µm.

6. The method according to claim 1, wherein the substrate is a glass substrate.

7. The method according to claim 1, wherein an annealing temperature is from 250 to 600° C.

8. The method according to claim 1, further comprising:
   forming a solder-receiving layer on the thermoelectric conversion material layer transferred in (D), or on the chip of a thermoelectric conversion material individualized in (E), or on the chip of a thermoelectric conversion material peeled in (F).

9. The method according to claim 8, wherein the solder-receiving layer is formed of a metal material.

10. A method for producing a thermoelectric conversion module of a combination of plural chips of a thermoelectric conversion material produced in the method according to claim 1, the method comprising:
    (i) forming a first electrode on a first resin film,
    (ii) forming a second electrode on a second resin film,
    (iii) forming a bonding material layer 1 on the first electrode, (iv) mounting one surface of the chip of a thermoelectric conversion material, on the bonding material layer 1, (v) bonding one surface of the chip of a thermoelectric conversion material to the first electrode via the bonding material layer 1, and (vi) bonding the other surface of the chip of a thermoelectric conversion material after (v), to the second electrode, via a bonding material layer 2.

11. A method for producing a thermoelectric conversion module of a combination of plural chips of a thermoelectric conversion material produced in the method according to claim 1, the method comprising:

(I) forming a first electrode on a first resin film, (II) forming a bonding material layer 1 on the first electrode, (III) mounting one surface of the chip of a thermoelectric conversion material on the bonding material layer 1, (IV) bonding one surface of the chip of a thermoelectric conversion material to the first electrode via the bonding material layer 1, and (V) bonding the other surface of the chip of a thermoelectric conversion material after (IV) to a resin film via a bonding material layer 3.

12. A method for producing a thermoelectric conversion module of a combination of plural chips of a thermoelectric conversion material produced according to the method of claim 8, the method comprising:

(xi) forming a first electrode on a first resin film, (xii) forming a second electrode on a second resin film, (xiii) forming a solder material layer on the first electrode, (xiv) mounting one surface having a solder-receiving layer of the chip of a thermoelectric conversion material, on the solder material layer, (xv) bonding one surface having the solder-receiving layer of the chip of a thermoelectric conversion material to the first electrode via the solder material layer, (xvi) forming a solder-receiving layer on the other surface of the chip of a thermoelectric conversion material after (xv), and (xvii) bonding the solder-receiving layer on the other surface of the chip of a thermoelectric conversion material after (xvi), to the second electrode via a solder material layer.

13. A method for producing a thermoelectric conversion module of a combination of plural chips of a thermoelectric conversion material produced according to the method of claim 8, the method comprising:

(XI) forming a first electrode on a first resin film, (XII) forming a solder material layer on the first electrode, (XIII) mounting one surface having a solder-receiving layer of the chip of a thermoelectric conversion material, on the solder material layer, (XIV) bonding one surface having a solder-receiving layer of the chip of a thermoelectric conversion material, to the first electrode via the solder material layer, and (XV) bonding the other surface of the chip of a thermoelectric conversion material after: (XIV), to a resin film via a bonding material layer 3.

14. The method according to claim 10, wherein the bonding material layer 1 and the bonding material layer 2 each are independently formed of a solder material, an electroconductive adhesive or a sintering bond.

15. The method according to claim 11, wherein the bonding material layer 3 is formed of a resin material.

* * * * *